United States Patent
Hara et al.

(10) Patent No.: US 9,230,664 B2
(45) Date of Patent: Jan. 5, 2016

(54) NONVOLATILE MEMORY AND DATA WRITING METHOD

(71) Applicant: Kabushiki Kaisha Toshiba, Minato-ku (JP)

(72) Inventors: Tokumasa Hara, Kawasaki (JP); Noboru Shibata, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/482,495

(22) Filed: Sep. 10, 2014

(65) Prior Publication Data

US 2015/0357040 A1    Dec. 10, 2015

Related U.S. Application Data

(60) Provisional application No. 62/008,967, filed on Jun. 6, 2014.

(51) Int. Cl.
G11C 16/04 (2006.01)
G11C 16/10 (2006.01)
G11C 16/34 (2006.01)

(52) U.S. Cl.
CPC ............. *G11C 16/10* (2013.01); *G11C 16/34* (2013.01)

(58) Field of Classification Search
USPC .................. 365/185.03, 185.17, 185.12
See application file for complete search history.

(56) References Cited

U.S. PATENT DOCUMENTS

| | | | |
|---|---|---|---|
| 8,054,684 B2 | 11/2011 | Gorobets et al. | |
| 8,130,552 B2 | 3/2012 | Miwa et al. | |
| 8,473,809 B2 | 6/2013 | Wan et al. | |
| 2008/0144370 A1* | 6/2008 | Park et al. .......... | G11C 11/5628 365/185.03 |
| 2013/0077402 A1 | 3/2013 | Izumi | |
| 2013/0145234 A1 | 6/2013 | Yoon et al. | |

FOREIGN PATENT DOCUMENTS

| | | |
|---|---|---|
| JP | 2012-502408 | 1/2012 |
| JP | 2013-69392 | 4/2013 |
| JP | 2013-120619 | 6/2013 |

* cited by examiner

*Primary Examiner* — Vu Le
(74) *Attorney, Agent, or Firm* — Oblon, McClelland, Maier & Neustadt, L.L.P.

(57) ABSTRACT

According to one embodiment, a nonvolatile memory includes a memory cell array having a plurality of memory cells configured to store 3-bit data corresponding to first to third pages. Data coding, in which first page data values have one boundary, and second and three page data values each have three boundaries, is used to perform a first stage program based on data written into first page d, a second stage program based on data written into the first, second, and third pages, and a third stage program based on data written into the first, second, and third pages.

20 Claims, 14 Drawing Sheets

FIG.5

| PAGE | DATA | | | | | | | |
|---|---|---|---|---|---|---|---|---|
| UPPER | 1 | 0 | 0 | 1 | 1 | 1 | 0 | 0 |
| MIDDLE | 1 | 1 | 0 | 0 | 0 | 1 | 1 | 0 |
| LOWER | 1 | 1 | 1 | 1 | 0 | 0 | 0 | 0 |

$Vr1 \quad Vr2 \quad Vr3 \quad Vr4 \quad Vr5 \quad Vr6 \quad Vr7$

FIG.7

| WL NUMBER | PROGRAM STAGE | | |
|---|---|---|---|
| | 1ST | 2ND | 3RD |
| 0 | S1 | S3 | S6 |
| 1 | S2 | S5 | S9 |
| 2 | S4 | S8 | S12 |
| 3 | S7 | S11 | |
| 4 | S10 | | |
| 5 | | | |

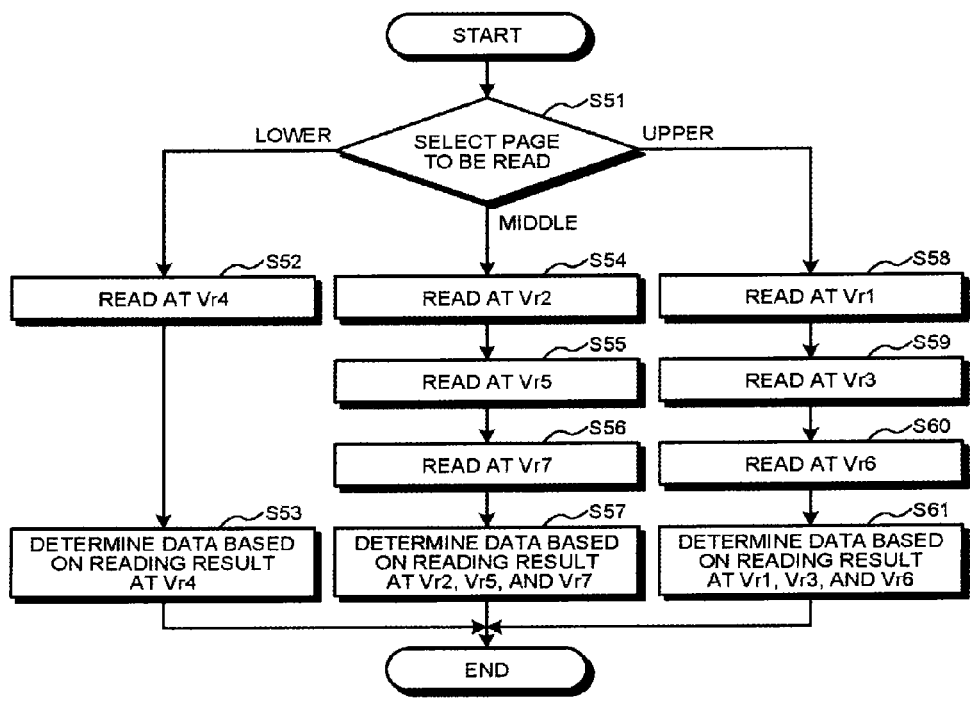

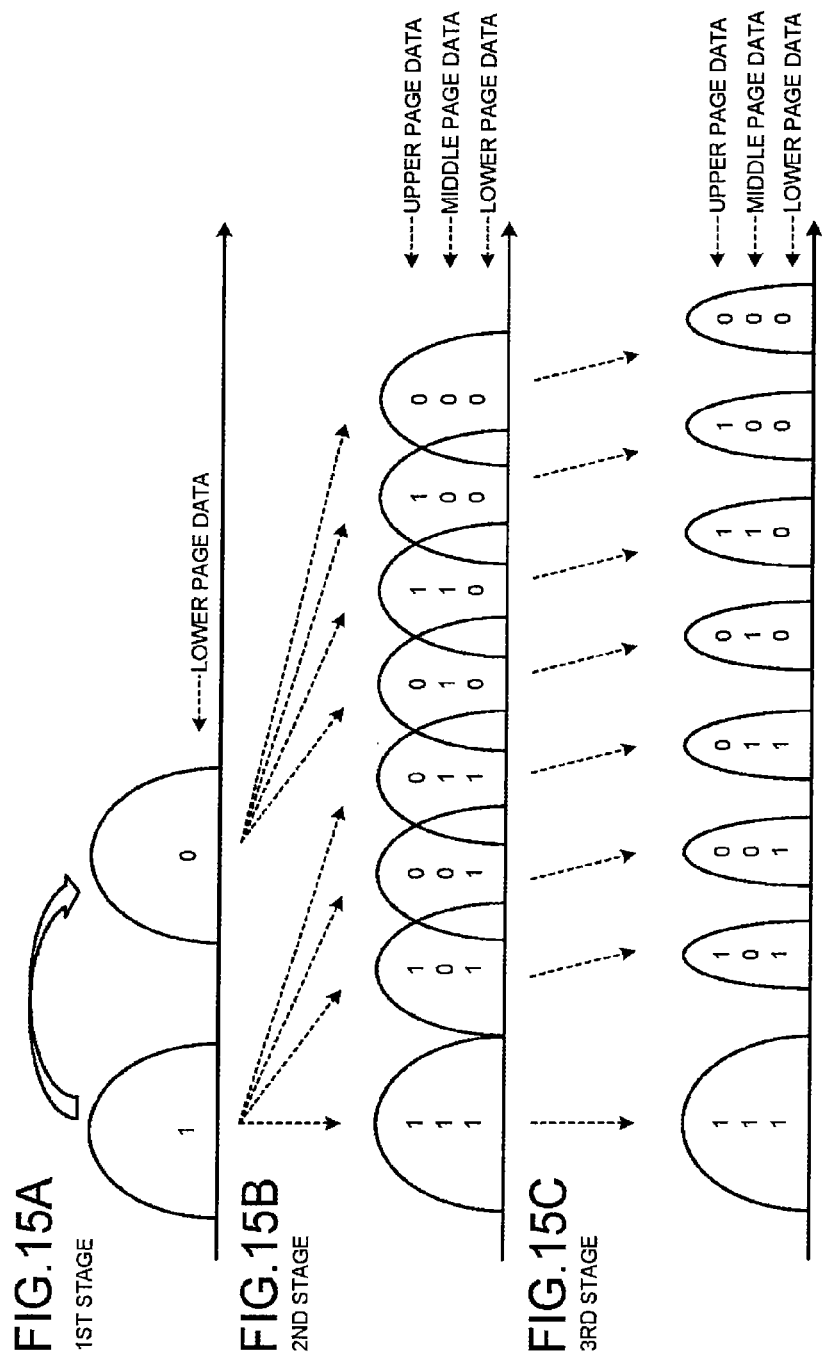

NONVOLATILE MEMORY AND DATA WRITING METHOD

CROSS-REFERENCE TO RELATED APPLICATIONS

This application is based upon and claims the benefit of priority from U.S. Provisional Application No. 62/008,967, filed on Jun. 6, 2014; the entire contents of which are incorporated herein by reference.

FIELD

Embodiments relate to a nonvolatile memory and a data writing method.

BACKGROUND

In a conventional NAND flash memory (hereinafter called NAND memory), information is stored as an amount of electric charge in each of floating gates of memory cells. Each memory cell has a threshold voltage according to an amount of electric charge. A plurality of data values to be stored in the memory cell is made to correspond to a plurality of threshold voltage regions. Electric charge is injected so that the threshold voltage of the memory cell is in a region corresponding to the data value to be stored. When data is read, it is determined in which region the threshold voltage of the memory cell exists. Accordingly the data value stored in the memory cell is allowed to be obtained.

A NAND memory with 3-bit/Cell configured to store 3-bit data in one memory cell has a larger number of threshold voltage regions than that of a NAND memory with 1-bit/Cell configured to store 1-bit data in one memory cell or a NAND memory with 2-bit/Cell configured to store 2-bit data in one memory cell. Therefore, the NAND memory with 3-bit/Cell needs to be precisely adjusted in threshold voltage, compared with the NAND memory with 1-bit/Cell or 2-bit/Cell. In addition, influence of interference between adjacent memory cells is increased between adjacent memory cells.

BRIEF DESCRIPTION OF THE DRAWINGS

FIG. 5 is a diagram illustrating data coding of the first embodiment;

FIG. 7 is a diagram illustrating an exemplary programming sequence of the first embodiment;

FIG. 13 is a flowchart illustrating an exemplary reading procedure of the first embodiment;

FIG. 14 is a diagram illustrating data coding of a second embodiment;

FIGS. 15A to 15C are diagrams illustrating exemplary threshold distributions programming in respective program stages of the second embodiment;

DETAILED DESCRIPTION

According to the present embodiment, a nonvolatile memory includes a memory cell array having a plurality of memory cells configured to store 3-bit data corresponding to first to third pages. The nonvolatile memory uses data coding in which the first page has one boundary between data values, the second and third pages have three boundaries between data values in order to execute a first stage program based on the data of the first page, a second stage program based on data written into the first, second, and third pages, and a third stage program based on data written into the first, second, and third pages.

A nonvolatile memory and a data writing method according to embodiments will be explained below in detail with reference to the accompanying drawings. It should be understood that the invention is not limited to these embodiments.

First Embodiment

Figure 1:
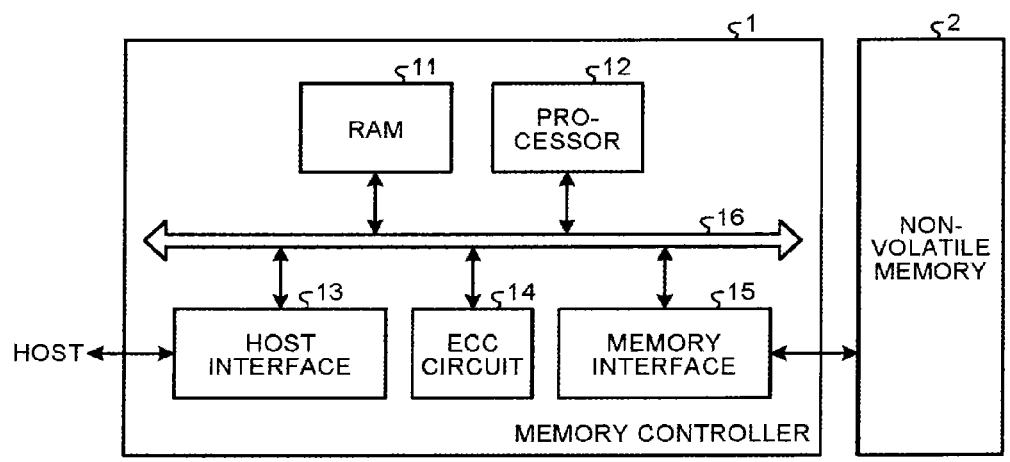
FIG. 1 is a block diagram illustrating an exemplary configuration of a memory device of a first embodiment.

FIG. 1 is a block diagram illustrating an exemplary configuration of a memory device of a first embodiment. The memory device of the present embodiment includes a memory controller 1 and a nonvolatile memory 2. The memory device can be connected to a host. The host includes electronic devices such as personal computers or mobile terminals.

The nonvolatile memory 2 is configured to store data in a nonvolatile manner, and includes a NAND memory, for example. In the present embodiment, descriptions are given on condition that the nonvolatile memory 2 is a NAND memory having a memory cell for storing 3-bit data per memory cell, or a NAND memory with 3-bit/Cell.

The memory controller 1 controls data writing into the nonvolatile memory 2 according to a write command from the host. Further, the memory controller 1 controls data reading from the nonvolatile memory 2 according to a read command from the host. The memory controller 1 includes a RAM 11, a processor 12, a host interface 13, an ECC circuit 14, and a memory interface 15. The RAM (random access memory) 11, the processor 12, the host interface 13, the ECC circuit 14, and the memory interface 15 are connected to each other through an internal bus 16.

The host interface 13 outputs a command, user data (written data), or the like received from the host into the internal bus 16. Further, the host interface 13 transmits user data read from the nonvolatile memory 2, reply from the processor 12, or the like to the host.

The memory interface 15 controls writing/reading of the user data or the like into/from the nonvolatile memory 2 based on an instruction from the processor 12.

The processor 12 generally controls the memory controller 1. The processor 12 includes, for example, a central processing unit (CPU) or a micro processing unit (MPU). Upon receiving a command from the host through the host interface 13, the processor 12 performs control according to the command. For example, the processor 12 instructs the memory interface 15 to write user data and parity data to the nonvolatile memory 2 according to the command from the host. Further, the processor 12 instructs the memory interface 15 to read the user data and the parity data from the nonvolatile memory 2 according to the command from the host.

The processor 12 determines a storage region (memory region) on the nonvolatile memory 2 for the user data stored in the RAM 11. The user data is stored into the RAM 11 through the internal bus 16. The processor 12 determines the memory region for data per page (page data) as a writing unit. In the present specification, user data stored in one page of the nonvolatile memory 2 is defined as unit data. The unit data is generally encoded, and stored in the nonvolatile memory 2 as a code word. In the present embodiment, the encoding is not essential. The unit data not encoded may be stored in the nonvolatile memory 2. FIG. 1 illustrates an exemplary configuration for encoding. When the encoding is not performed, the page data coincides with the unit data. One code word may be generated based on one unit data. One code word may be generated based on divided data obtained by dividing the unit data. Further, one code word may be generated using a plurality of unit data.

The processor 12 determines, for each unit data, a memory region of the nonvolatile memory 2 into which the unit date is to be written. Physical addresses are assigned to the memory regions of the nonvolatile memory 2. The processor 12 manages the memory regions into which the unit data are written, using the physical addresses. The processor 12 specifies the determined memory region (physical address) to instruct the memory interface 15 to write the user data into the nonvolatile memory 2. The processor 12 manages correspondence between a logical address of the user data (logical address managed by host) and the physical address. When the read command including the logical address is received from the host, the physical address corresponding to the logical address is identified, and the physical address is specified to instruct the memory interface 15 to read the user data.

In the present specification, the memory cells connected to one common word line are defined as a memory cell group. In the present embodiment, the nonvolatile memory 2 is the NAND memory with 3-bit/Cell, and one memory cell group corresponds to three pages. In the present embodiment, the three pages are referred to as a Lower page (first page), a Middle page (second page), and an Upper page (third page), respectively. The one memory cell group includes a lower bit for forming a Lower page, a middle bit for forming a Middle page, and an upper bit for forming an Upper page, wherein the 3-bit data of each memory cell is represented as the lower, middle, and upper bits.

The ECC circuit 14 encodes the user data stored in the RAM 11 to generate a code word. The ECC circuit 14 decodes the code word read from the nonvolatile memory 2.

The RAM 11 temporarily stores the user data received from the host until the user data is stored in the nonvolatile memory 2, and temporarily stores data read from the nonvolatile memory 2 until the data is transmitted to the host. The RAM 11 includes a general-purpose memory such as a static random access memory (SRAM) or a dynamic random access memory (DRAM).

FIG. 1 illustrates an exemplary configuration of the memory controller 1 including the ECC circuit 14 and the memory interface 15 separately. However, the ECC circuit 14 may be included in the memory interface 15. The ECC circuit 14 may be included in the nonvolatile memory 2.

Figure 2:
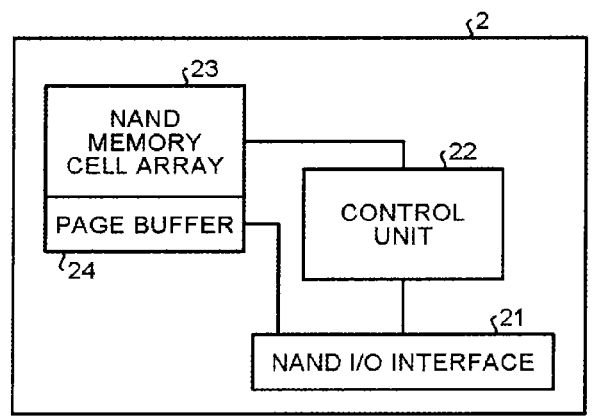
FIG. 2 is a block diagram illustrating an exemplary configuration of a nonvolatile memory of the first embodiment.

FIG. 2 is a block diagram illustrating an exemplary configuration of the nonvolatile memory 2 of the present embodiment. The nonvolatile memory 2 includes a NAND I/O Interface 21, a control unit 22, a NAND memory cell array (memory cell portion) 23, and a page buffer 24. The nonvolatile memory 2 includes, for example, a one-chip semiconductor substrate (e.g., silicon substrate).

The control unit 22 controls the operation of the nonvolatile memory 2 based on a command or the like input from the memory controller 1 through the NAND I/O Interface 21. In particular, when a write request is input, the nonvolatile memory is controlled to write data, which is requested to be written, to an address specified on the NAND memory cell array 23. When a read request is input, the control unit 22 controls data, which is requested to be read, to be read from the NAND memory cell array 23 to be output to the memory controller 1 through the NAND I/O Interface 21. The page buffer 24 is configured to temporarily store data input from the memory controller 1 when data is written into the NAND memory cell array 23, or temporarily store data read from the NAND memory cell array 23.

Figure 3:
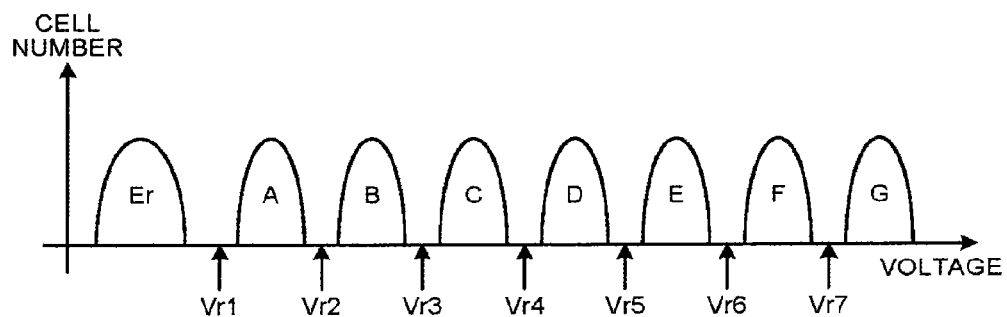
FIG. 3 is a diagram illustrating exemplary threshold regions of the first embodiment.

FIG. 3 is a diagram illustrating exemplary threshold regions of the present embodiment. In the NAND memory, information is stored as an amount of electric charge stored in each of floating gates of memory cells. Each memory cell has a threshold voltage according to an amount of electric charge. A plurality of data values stored in the memory cell are made to correspond to a plurality of threshold voltage regions (threshold regions), respectively. Eight distributions (peaks) of Er, A, B, C, D, E, F, and G of FIG. 3 represent respective threshold distributions in the eight threshold regions. A horizontal axis of FIG. 3 represents the threshold voltages, and a vertical axis thereof represents the distribution of the number of memory cells (cell number). In the present embodiment,
a region having a threshold voltage of Vr1 or less is called a region Er,
a region having a threshold voltage of more than Vr1 and Vr2 or less is called a region A,
a region having a threshold voltage of more than Vr2 and Vr3 or less is called a region B,
a region having a threshold voltage of more than Vr3 and Vr4 or less is called a region C,
a region having a threshold voltage of more than Vr4 and Vr5 or less is called a region D,
a region having a threshold voltage of more than Vr5 and Vr6 or less is called a region E,
a region having a threshold voltage of more than Vr6 and Vr7 or less is called a region F, and
a region having a threshold voltage of more than Vr7 is called a region G. The threshold distributions
corresponding to the regions Er, A, B, C, D, E, F, and G are called distributions Er, A, B, C, D, E, F, and G (first to eighth distributions), respectively. Vr1 to Vr7 represent the threshold voltages (boundary voltages) as boundaries of the respective regions.

In the NAND memory, the plurality of data values corresponds to the plurality of threshold regions (i.e., threshold distributions) of the memory cell, respectively. This correspondence is called data coding. The data coding is previously set, and upon data writing (programming), electric charge is injected into the memory cell so as to be in the threshold region according to the data value to be stored according to the data coding. Upon data reading, a read voltage is applied to the memory cell, and data is determined according to the level of the threshold of the memory cell relative to the read voltage. When the threshold voltage is lower than the read voltage, the data is defined to be "erased" and to have a value of "1". When the threshold voltage is equal to or higher than the read voltage, the data is defined to be "programmed" and to have a value of "0".

Figure 4:
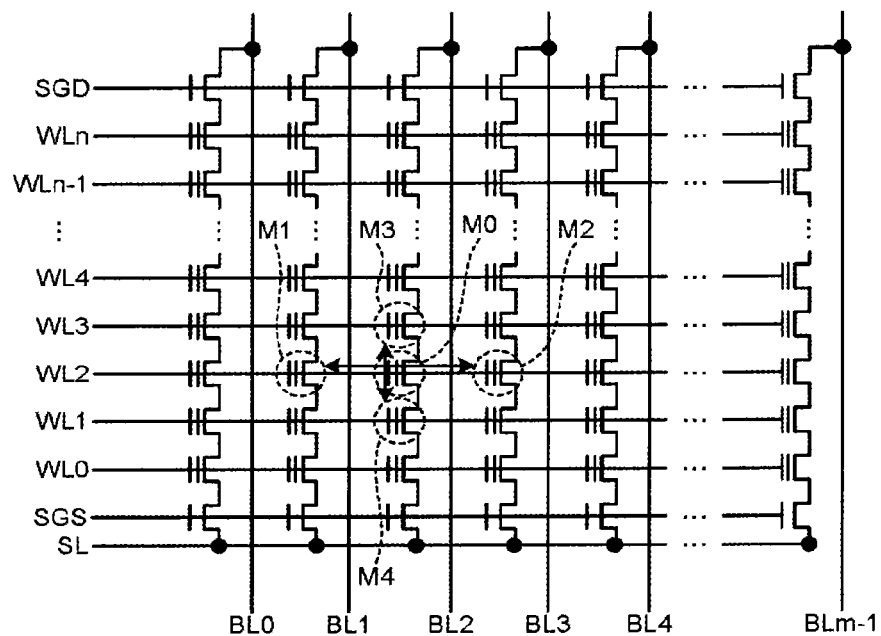
FIG. 4 is a diagram illustrating an exemplary configuration of a NAND memory cell array.

FIG. 4 is a diagram illustrating an exemplary configuration of the NAND memory cell array 23. The NAND memory cell array 23 of FIG. 4 has n+1 word lines WL0 to WLn and m bit lines BL0 to BLm-1. Each memory cell constituting the NAND memory cell array 23 is connected to a word line and a bit line. An electric charge accumulated in a floating gate of one memory cell disturbs an electric field of an adjacent memory cell. As a result, a noise is generated which changes a read threshold of the adjacent memory cell. Reading precision is deteriorated, when the adjacent memory cell is programmed to have a different electric charge after the programming and verification are performed under a certain electric field condition to finish programming. This phenomenon is called interference between adjacent memory cells. This interference between adjacent memory cells is generally caused by adjacent memory cells on the same word line and different bit lines and adjacent memory cells on the same bit line and different word lines. For example, the memory cell M0 is affected by electric charges of the adjacent memory cell M1 and memory cell M2 in a word line direction, and is affected by electric charges of the adjacent memory cell M3 and memory cell M4 in a bit line direction.

The interference between adjacent memory cells is increased as a memory device production technique is refined and an interval between memory cells is reduced. For example, in a 3-bit/Cell memory cell, an error tends to occur compared with in a 2-bit/Cell memory cell. The interference between the adjacent memory cells can be reduced by reducing a difference in electric field conditions of memory cells between programming and verifying data and reading data from the programmed adjacent memory cells. Accordingly, in order to reduce the interference between adjacent memory cells, a process for performing multistage program is performed in which writing (programming) is divided into a plurality of stages and considerable change in electric charge between the stages is prevented. As an exemplary employment of this process, 1-2-4 coding or 2-3-2 coding using the 3-bit/Cell memory cell is known as data coding. The data coding represents the correspondence between the threshold distributions (threshold regions) and data values. In the present embodiment, the data coding is expressed as $N_L$-$N_M$-$N_U$ coding, wherein $N_L$ data represents the number of boundaries for determining a data value in the Lower page, $N_M$ data represents the number of boundaries for determining a data value in the Middle page, and $N_U$ data represents the number of boundaries for determining a data value in the Upper page.

However, the 1-2-4 coding and the 2-3-2 coding have the following problems. The 1-2-4 coding has deviated numbers of boundaries between pages, and thus deviation in bit error rates between pages is increased. Most of bit errors, i.e., most of read errors are caused by the movement of the threshold to an adjacent distribution. Accordingly, a page having a larger number of boundaries has a larger number of bit errors. The 1-2-4 coding has a maximum number of boundaries of four, and is required to have an error correction function for handling a bit error corresponding to four boundaries. Therefore, the speed, cost, and power consumption of the memory device are deteriorated. Further, the deviation in number of boundaries also causes deviation in reading speed.

The 2-3-2 coding disadvantageously requires input of data of three pages in all the stages to write data through the three stages. Therefore, the time for inputting data is increased, and the writing speed of the memory device is lowered. Further, in the memory device, the capacity of a write buffer to hold data for the input to the nonvolatile memory increases.

In the present embodiment, 1-3-3 coding is used to write data through the three stages as described below. Thus, a data read error caused by the interference between adjacent memory cells is prevented, the deviation in bit error rate is reduced, and the time for inputting data is reduced.

FIG. 5 illustrates data coding of the present embodiment. In the present embodiment, the eight threshold distributions (threshold regions) illustrated in FIG. 3 are made to correspond to eight 3-bit data values, respectively. As illustrated in FIG. 5, in the memory cell having the threshold voltage within the Er region, "111" is stored as a bit data value corresponding to the Upper, Middle, and Lower pages. The memory cell having the threshold voltage within the A region stores "011". The memory cell having the threshold voltage within the B region stores "001". The memory cell having the threshold voltage within the C region stores "101". The memory cell having the threshold voltage within the D region stores "100". The memory cell having the threshold voltage within the E region stores "110". The memory cell having the threshold voltage within the F region stores "010". The memory cell having the threshold voltage within the G region stores "000". It is noted that while data is not written in the memory cell ("erasure" condition), the threshold voltage of the memory cell is within the Er region. The coding illustrated in FIG. 5 uses a Gray code in which data changes by only 1 bit between any two adjacent regions.

In the coding of the present embodiment illustrated in FIG. 5, the threshold voltage as the boundary for determination of a bit value in the Lower page is defined as Vr4. The threshold voltages as the boundaries for determination of a bit value in the Middle page are defined as Vr2, Vr5, and Vr7. The threshold voltages as the boundaries for determination of a bit value in the Upper page are defined as Vr1, Vr3, and Vr6. The numbers of threshold voltages (hereinafter called the number of boundaries), as the boundaries for determination of a bit value, are 1, 3, and 3 in the Lower page, Middle page, and Upper page, respectively. That is, the coding of the present embodiment employs 1-3-3 coding. The control unit 22 of the nonvolatile memory 2 controls programming to the NAND memory cell array 23 and reading from the NAND memory cell array 23, based on the coding illustrated in FIG. 5.

In the present embodiment, in order to reduce interference between adjacent memory cells, writing is performed in three program stages, i.e., a first stage (1st stage), a second stage (2nd stage), and a third stage (3rd stage). Each of the program stages is defined as a programming performance unit, and the programming of one word line is completed by performing the three program stages.

Figure 6:
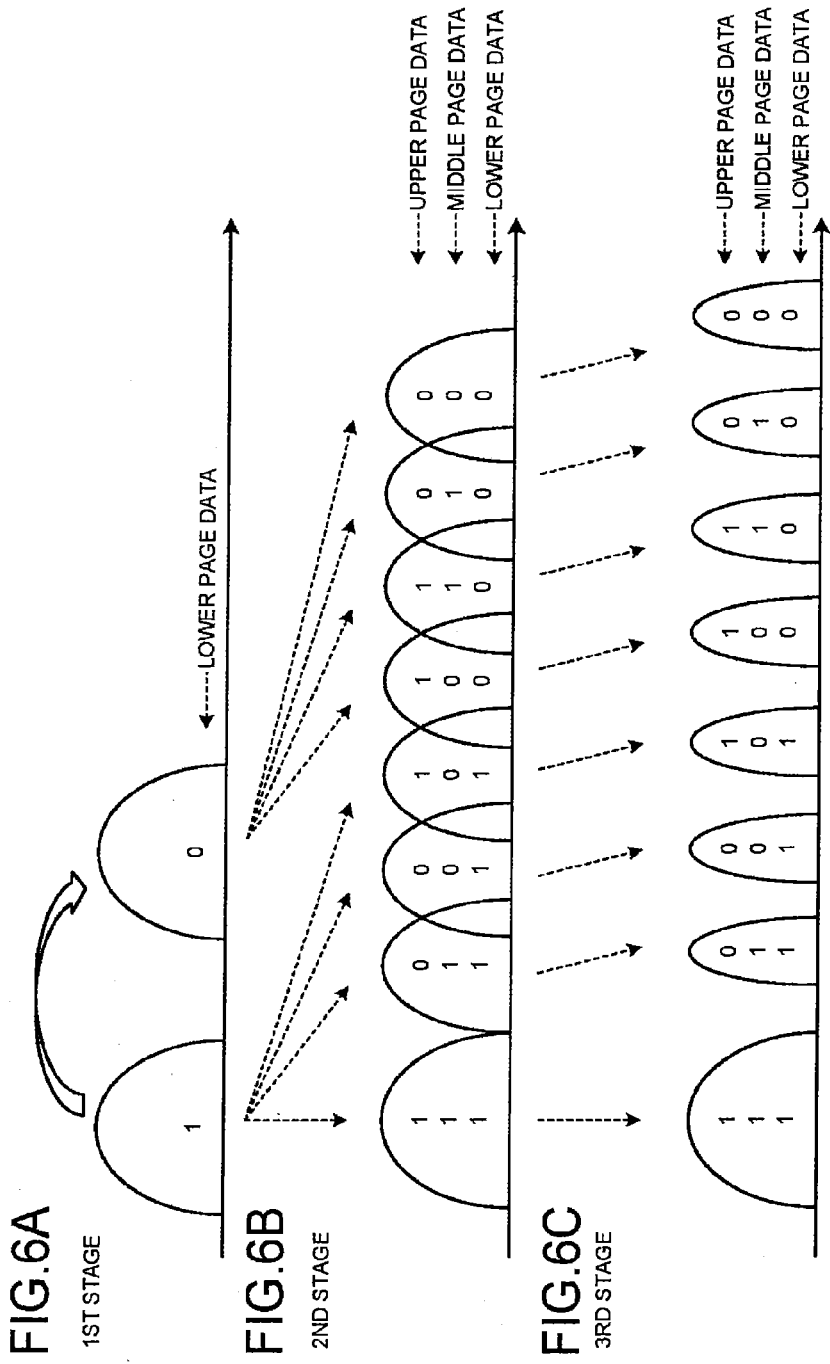
FIGS. 6A to 6C illustrate exemplary threshold distributions after programming in respective program stages of the first embodiment.

FIGS. 6A to 6C are diagrams illustrating the exemplary threshold distributions after programming in respective program stages. FIG. 6A illustrates threshold distributions after the first stage program, FIG. 6B illustrates threshold distributions after the second stage program, and FIG. 6C illustrates threshold distributions after the third stage program. It should be noted that in the first stage program, input data uses Lower page data. This is because the Lower page has the number of boundaries of 1 in the coding of the present embodiment. The data after the first stage program looks like binary data, and thus the Lower page data looks like capable of being read after the first stage program. However, for the reduction of interference between adjacent memory cells, the boundary between the two threshold distributions used in the first stage preferably has a threshold voltage lower than the threshold voltage Vr4 of the boundary in final data coding. Accordingly, sometimes the data can be read or cannot be read according to a characteristic of the memory cell or restriction in design of a circuit.

According to FIG. 6B, in the second stage, eight threshold distributions are used to perform programming. The threshold distributions (threshold regions) have a width larger than that of the threshold distributions in the final data coding, as illustrated in FIGS. 6B and 6C. In the second stage, each of the threshold distributions has a minimum threshold voltage lower than a minimum threshold voltage of a corresponding threshold distribution in the final data coding. The second stage program requires all the input data of the three pages. In the threshold distributions after second stage program, the data cannot be read since adjacent distributions are in an intermediate state, that is, superposed on each other.

According to FIG. 6C, in the third stage, the threshold distributions after the second stage program are shifted to threshold distributions in the final data coding. The third stage program also requires all the input data of the three pages. In the threshold distributions after the third stage program, adjacent distributions are finally separated, and data can be read after the third stage program.

Accordingly, data having been programmed by the multi-stage program, i.e., the first to third stage program, cannot be read until the programming is completed in the final third stage.

It is noted that the programming is typically performed by applying a programming voltage pulse once or a plurality of times. After application of the programming voltage pulse, reading (verification) is performed to confirm the shift of the electric charge of the memory cell over a threshold boundary level. These operations are repeated to shift the threshold of the memory cell within a predetermined threshold distribution range. In particular, the processor 12 of the memory controller 1 instructs the nonvolatile memory 2 to perform the programming and the verification in each stage through the memory interface 15. The control unit 22 of the nonvolatile memory 2 performs application of the programming voltage pulse to the NAND memory cell array 23 and the verification thereof based on the instruction from the memory controller 1. Hereinafter, the verification is performed for each programming, but description of the verification will be omitted.

Figure 8:
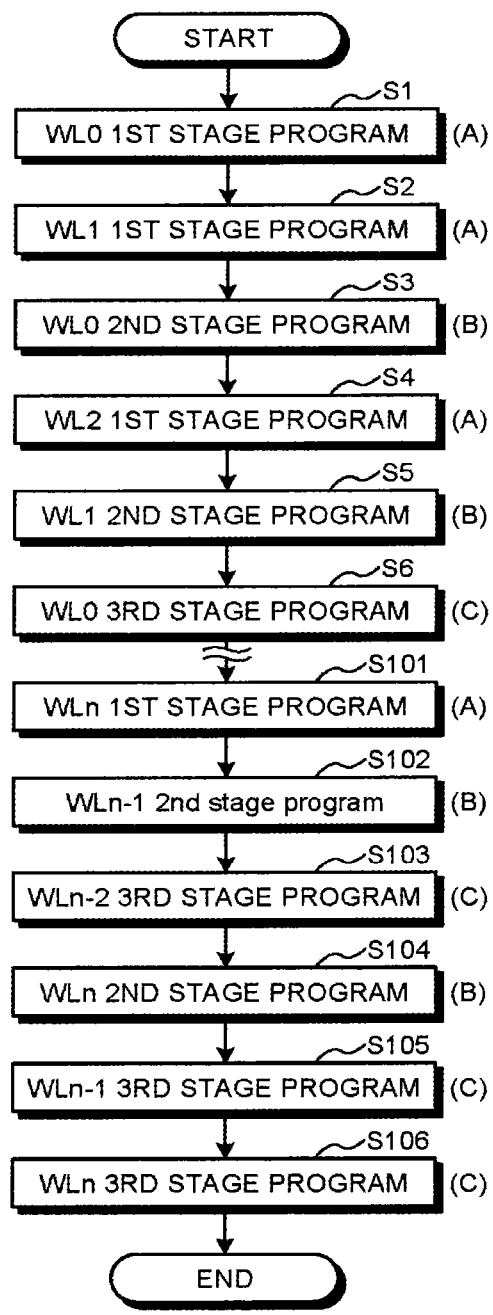
FIG. 8 is a flowchart illustrating an exemplary writing procedure according to the programming sequence of FIG. 7.

Further, the first, second, and third stage programs may be performed sequentially for one word line. Alternatively, for reduction in influence of the interference between the adjacent memory cells, the first, second, and third stage programs may be performed non-sequentially over a plurality of word lines. FIG. 7 is a diagram illustrating an exemplary programming sequence of the present embodiment. FIG. 8 is a flowchart illustrating an exemplary writing procedure according to the programming sequence of FIG. 7. FIG. 8 illustrates a writing procedure for one block, wherein the one block has n+1 word lines WL0 to WLn. Note that letters (A), (B), and (C) assigned on the right side of the steps of FIG. 8 correspond to the stages of FIGS. 6A to 6C.

As illustrated in FIGS. 7 and 8, when the writing is started, the control unit 22 performs the first stage program for the word line WL0 based on the instruction from the processor 12 (step S1). It is noted that, also in subsequent processing, programming operation of the control unit 22 is performed based on the instruction from the processor 12, but the description of the instruction from the processor 12 is omitted for simplification. The control unit 22 then performs the first stage program for the word line WL1 (step S2). Next, the control unit 22 performs the second stage program for the word line WL0 (step S3). Next, the control unit 22 performs the first stage program for the word line WL2 (step S4).

Next, the control unit 22 performs the second stage program for the word line WL1 (step S5). Next, the control unit 22 performs the third stage program for the word line WL0 (step S6). Subsequent processing is similarly performed in an order indicated by obliquely upward arrows as illustrated in FIG. 7, and the control unit 22 performs the first stage program for the word line WLn (step S101). Next, the control unit 22 performs the second stage program for the word line WLn-1 (step S102). Next, the control unit 22 performs the third stage program for the word line WLn-2 (step S103).

The control unit 22 performs the second stage program for the word line WLn (step S104). The control unit 22 performs the third stage program for the word line WLn-1 (step S105). The control unit 22 performs the third stage program for the word line WLn (step S106).

For effective reduction of the interference between adjacent memory cells between the word lines, after the first to third stage programs are completed for a word line, a variation in threshold of another word line adjacent to the word line is reduced. According to the sequence of FIGS. 7 and 8, the third program stage is performed for the another word line adjacent to the word line after the completion of the first to third stage programs.

Figure 9:
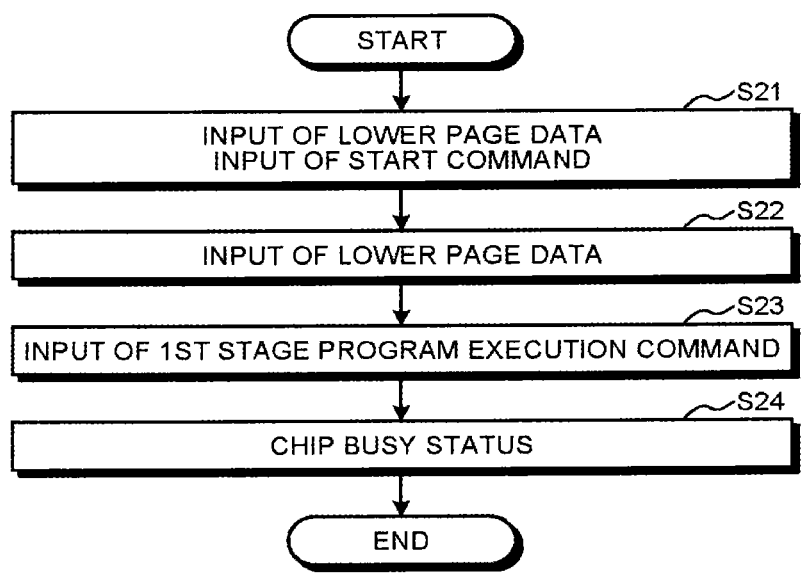
FIG. 9 is a diagram illustrating an exemplary procedure of executing a first stage program.

FIG. 9 is a diagram illustrating an exemplary procedure of executing the first stage program. In the first stage program, first, a command for starting input of the Lower page data is input from the memory controller 1 to the nonvolatile memory 2 (step S21). The Lower page data is input from the memory controller 1 to the nonvolatile memory 2 (step S22). A first stage program execution command is input from the memory controller 1 to the nonvolatile memory 2 (step S23), and a chip busy status is generated (step S24).

Figure 10:
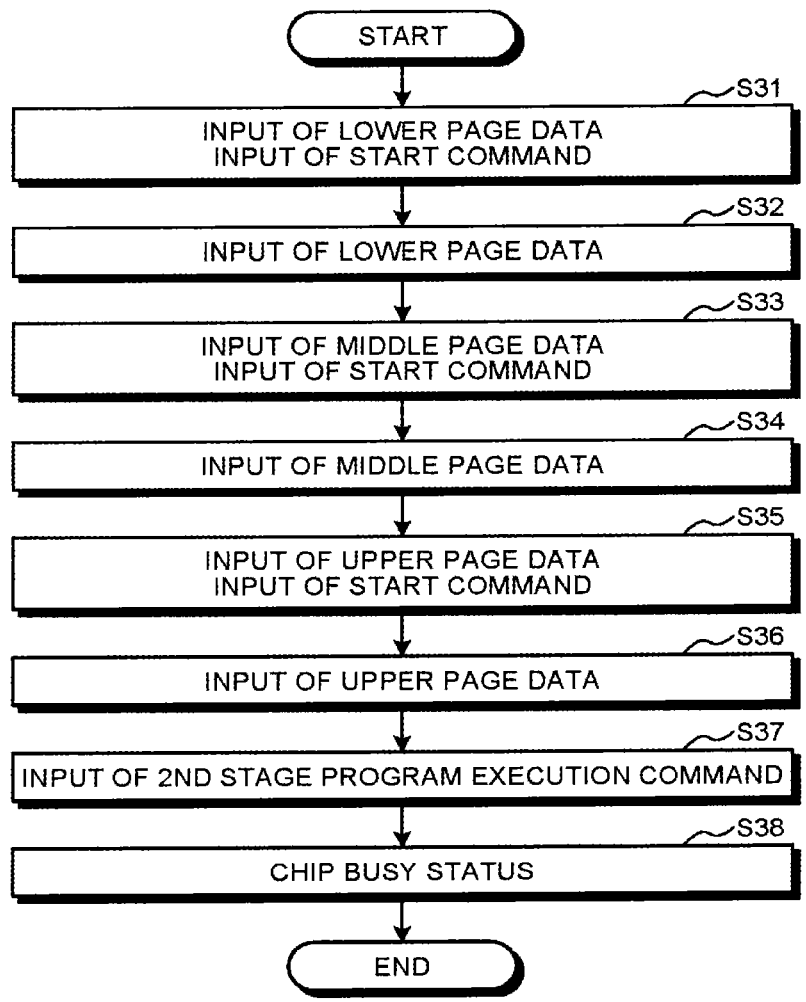
FIG. 10 is a diagram illustrating an exemplary procedure of executing a second stage program.

FIG. 10 is a diagram illustrating an exemplary procedure of executing the second stage program. In the second stage program, first, the command for starting input of Lower page data is input from the memory controller 1 to the nonvolatile memory 2 (step S31). The Lower page data is input from the memory controller 1 to the nonvolatile memory 2 (step S32). Next, a command for starting input of Middle page data is input from the memory controller 1 to the nonvolatile memory 2 (step S33). The Middle page data is input from the memory controller 1 to the nonvolatile memory 2 (step S34). Next, a command for starting input of Upper page data is input from the memory controller 1 to the nonvolatile memory 2 (step S35). The Upper page data is input from the memory controller 1 to the nonvolatile memory 2 (step S36). Next, a second stage program execution command is input from the memory controller 1 to the nonvolatile memory 2 (step S37), and the chip busy status is generated (step S38).

Figure 11:
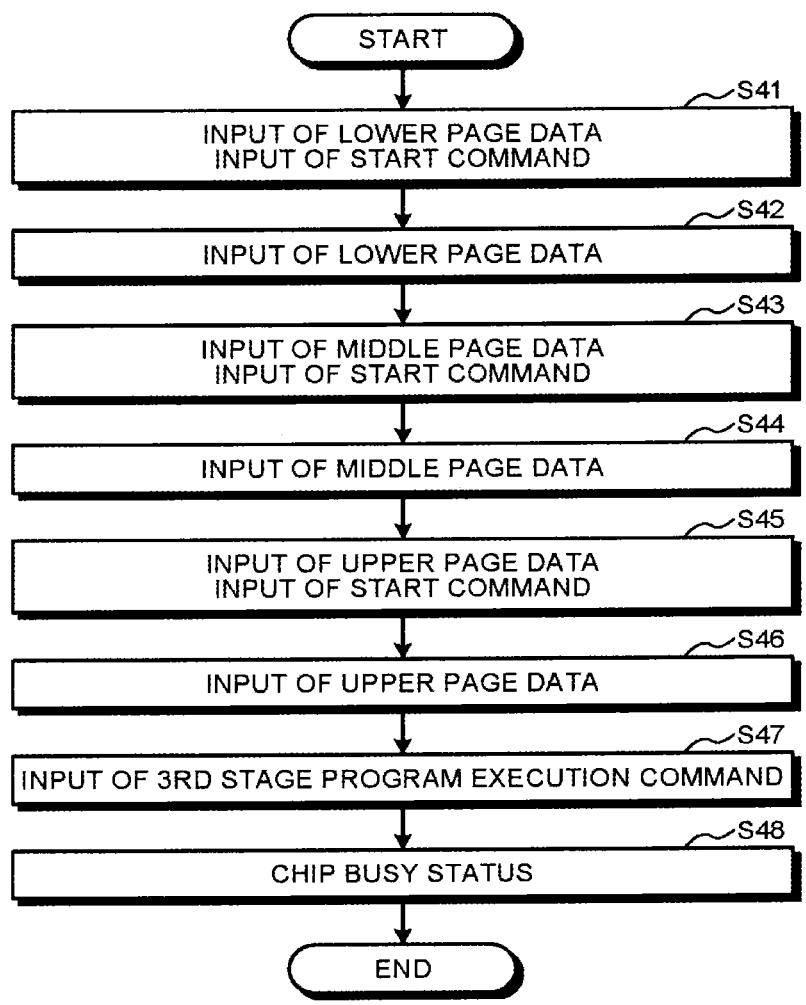
FIG. 11 is a diagram illustrating an exemplary procedure of executing a third stage program.

FIG. 11 is a diagram illustrating an exemplary procedure of executing the third stage program. In the third stage program, first, the command for starting input of Lower page data is input from the memory controller 1 to the nonvolatile memory 2 (step S41). The Lower page data is input from the memory controller 1 to the nonvolatile memory 2 (step S42). Next, the command for starting input of Middle page data is input from the memory controller 1 to the nonvolatile memory 2 (step S43). The Middle page data is input from the memory controller 1 to the nonvolatile memory 2 (step S44). Next, the command for starting input of Upper page data is input from the memory controller 1 to the nonvolatile memory 2 (step S45). The Upper page data is input from the memory controller 1 to the nonvolatile memory 2 (step S46). Next, a third stage program execution command is input from the memory controller 1 to the nonvolatile memory 2 (step S47), and the chip busy status is generated (step S48).

Figure 12:
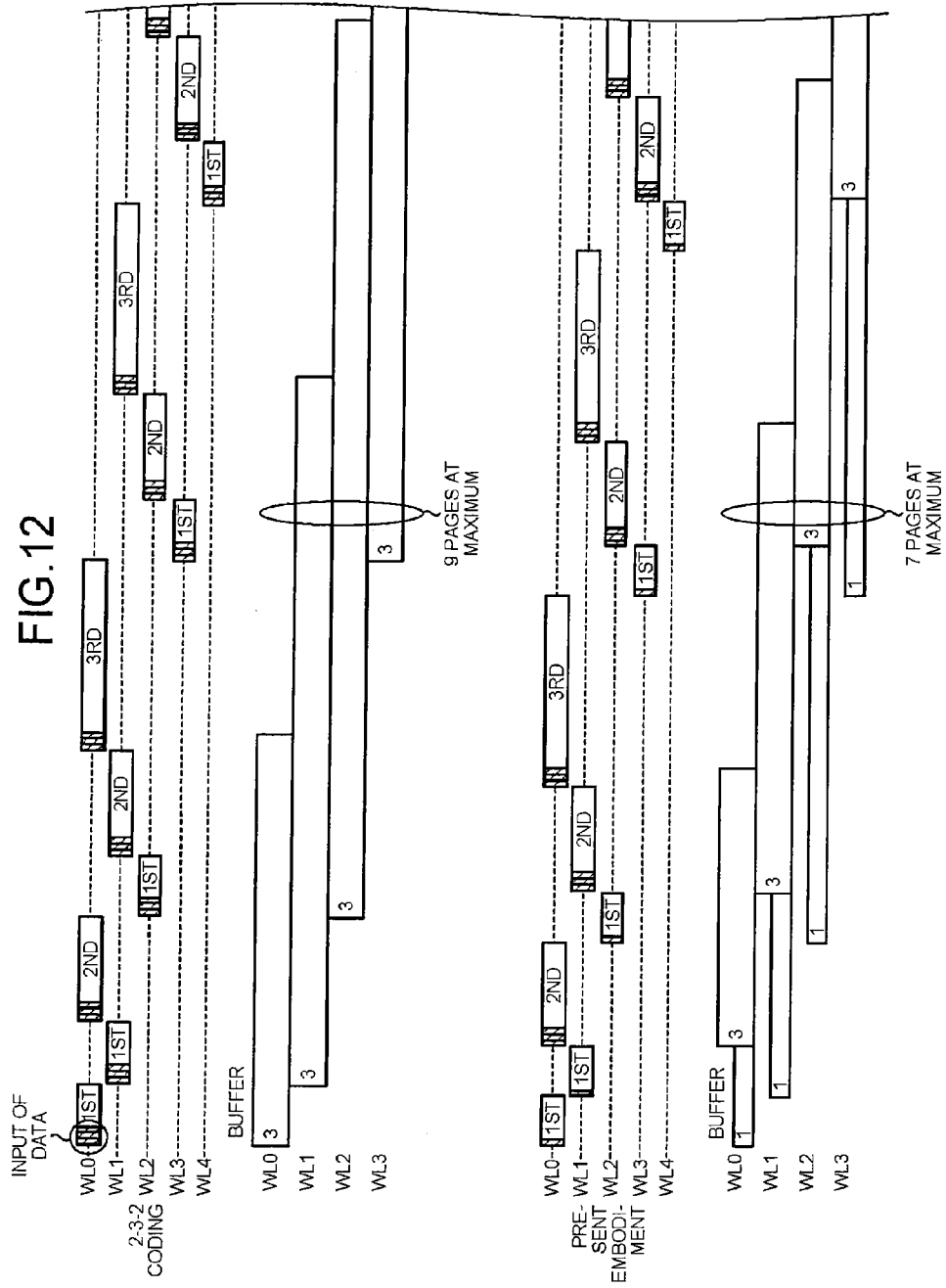
FIG. 12 is a diagram illustrating comparison between the writing using 2-3-2 coding and the writing of the present embodiment.

FIG. 12 is a diagram illustrating comparison between the writing using 2-3-2 coding and the writing of the present embodiment. In FIG. 12, rectangular portions in which 1st stage, 2nd stage, or 3rd stage is written have front hatched parts, and the hatched part represents a period for inputting data to be written. One hatched part of rectangular shape represents a period for inputting data of one page. The rectangular portions in which 1st stage, 2nd stage, or 3rd stage is written represent periods for executing the 1st stage, 2nd stage, and 3rd stage programs, respectively. As illustrated in FIG. 12, in writing of the present embodiment illustrated at the lower part of FIG. 12, the period for inputting data can be reduced in the first stage, as compared with the 2-3-2 coding illustrated at the upper part of FIG. 12. Accordingly, the writing speed can be increased and the power consumption can be reduced, as a whole. In particular, when the nonvolatile memory 2 has a plurality of memory chips, input of data to a next chip can be started as soon as preceding input of data is finished, and the writing speeds of the plurality of chips can be increased.

In the memory controller 1, generally, a partial region of the RAM 11 is assigned as a write buffer used for writing to the nonvolatile memory 2. Data used for each stage program are temporarily stored in the write buffer, and then input to the nonvolatile memory 2. According to the present embodiment, the Lower page data is held in the write buffer, from the input of data in the first stage until completion of programming in the third stage. After completion of the third stage program, the Lower page data region on the write buffer is released. The Middle page and Upper page data are held in the write buffer, from the input of data in the second stage until completion of programming in the third stage. As described above, writing to each word line is performed non-sequentially. Accordingly, the first to third stage programs are not performed sequentially for the one word line. Therefore, a status in which the three stage programming is continued for the word lines, and as illustrated in the lower part of FIG. 12, the write buffer is required to have a maximum data capacity of seven pages. On the contrary, in the 2-3-2 coding illustrated in the upper part of FIG. 12, the write buffer is required to have a maximum data capacity of nine pages. As described above, the present embodiment has the write buffer having a smaller capacity than that in the 2-3-2 coding.

FIG. 13 is a flowchart illustrating an exemplary reading procedure of the present embodiment. In the present embodiment, after execution of the first to third stage programs, reading can be performed. First, the control unit 22 selects a page to be read, and the page is selected from the Upper, Middle, and Lower pages (step S51). When the Lower page is selected (step S51 Lower), the reading is performed applying the threshold voltage Vr4 (step S52). The control unit 22 determines data (bit value of each memory cell) based on a result of reading applying the threshold voltage Vr4 (step S53), and the processing is finished.

When the Middle page is selected (step S51 Middle), the reading is performed applying the threshold voltage Vr2 (step S54). Next, the control unit 22 performs the reading applying the threshold voltage Vr5 (step S55). Then, the control unit 22 performs the reading applying the threshold voltage Vr7 (step S56). Data is determined based on the results of reading applying the threshold voltages Vr2, Vr5, and Vr7 (step S57), and the processing is finished.

When the Upper page is selected (step S51 Upper), reading is performed applying the threshold voltage Vr1 (step S58). Next, the control unit 22 performs the reading applying the threshold voltage Vr3 (step S59). Then, the control unit 22 performs the reading applying the threshold voltage Vr6 (step S60). The data is determined based on the results of reading applying the threshold voltages Vr1, Vr3, and Vr6 (step S61), and the processing is finished.

Second Embodiment

A data writing method and a data reading method according to a second embodiment will be described below. In the present embodiment, the memory device has a configuration similar to that of the memory device of the first embodiment. The difference between the first embodiment and the present embodiment will be described below.

FIG. 14 is a diagram illustrating data coding of the present embodiment. The present embodiment also employs 1-3-3 data coding. FIGS. 15A to 15C illustrate exemplary threshold distributions after programming in respective program stages of the present embodiment. FIG. 15A illustrates a status after a first stage program, FIG. 15B illustrates a status after a second stage program, and FIG. 15C illustrates a third stage program. The threshold distribution of each stage is similar to that of the first embodiment except for the difference in data values assigned to each threshold value distribution.

Figure 16:
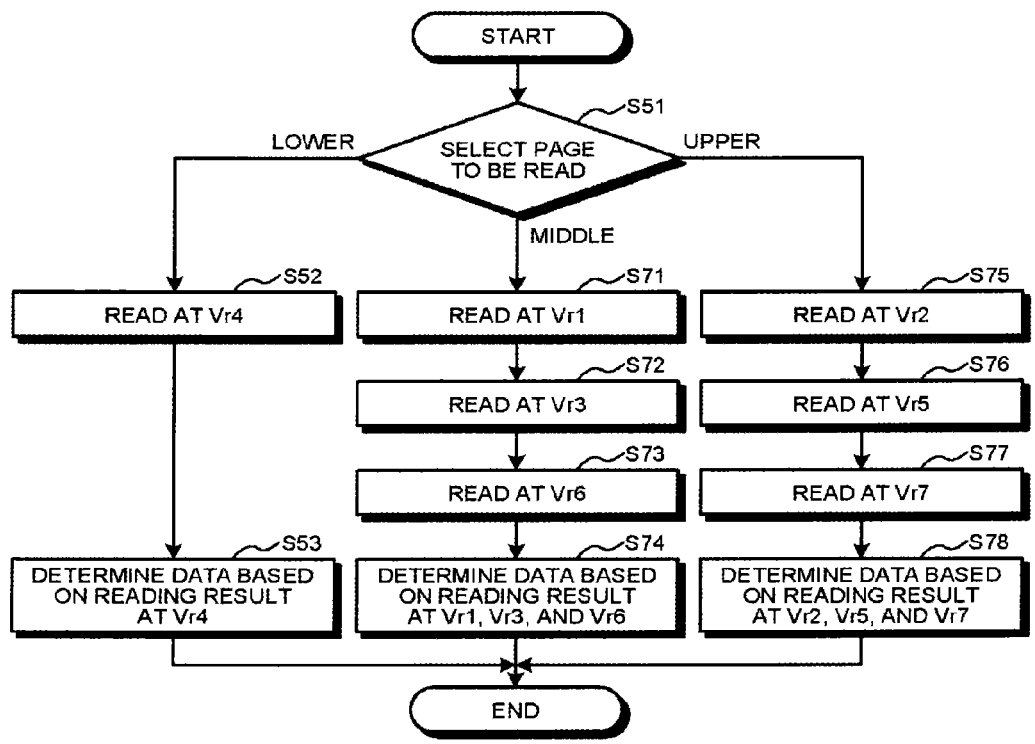
FIG. 16 is a flowchart illustrating an exemplary reading procedure of the second embodiment.

A data writing procedure of the present embodiment is similar to that of the first embodiment except for the difference in data values assigned to each threshold value distribution. FIG. 16 is a flowchart illustrating an exemplary reading procedure of the present embodiment. In the present embodiment, similarly to the first embodiment, reading can be performed after first to third stage programs are executed. Steps S51 to S53 are similar to those of the first embodiment.

When a Middle page is selected (step S51 Middle), a control unit 22 performs reading applying a threshold voltage Vr1 (step S71). Next, the control unit 22 performs the reading applying a threshold voltage Vr3 (step S72). Then, the control unit 22 performs the reading applying a threshold voltage Vr6 (step S73). The data is determined based on the results of reading applying the threshold voltages Vr1, Vr3, and Vr6 (step S74), and the processing is finished.

When an Upper page is selected (step S51 Upper), the control unit 22 performs reading applying a threshold voltage Vr2 (step S75). Next, the control unit 22 performs the reading applying a threshold voltage Vr5 (step S76). Then, the control unit 22 performs the reading applying a threshold voltage Vr7 (step S77). The data is determined based on the results of reading applying the threshold voltages Vr2, Vr5, and Vr7 (step S78), and the processing is finished.

As in the first embodiment, Lower page data is preferably input in a first stage in the second embodiment. Therefore, similarly to the first embodiment, writing speed can be increased and the capacity of a write buffer can be reduced, as compared with those of 2-3-2 coding.

Third Embodiment

Next, a reading method according to a third embodiment will be described. In the present embodiment, the memory device has a configuration similar to that of the memory device of the first embodiment. Further, in the present embodiment, a data writing method is similar to that of the first or second embodiment. A difference between the third embodiment and the first or second embodiment will be described below.

When a read voltage is applied to a word line for the purpose of reading, a time until obtaining a predetermined value of the read voltage applied to the word line is determined according to a voltage raised at a time. For example, the time until stabilizing the voltage value after raising the voltage increases when the voltage is raised at a time from Vr1 to Vr7, compared with when the voltage is raised from Vr1 to Vr2. Accordingly, when three pages in one word line are read at once, a reading time is further reduced by performing sequential reading as described below, compared with sequentially performing the reading procedure for three pages as illustrated in FIGS. 13 and 16.

Figure 17:
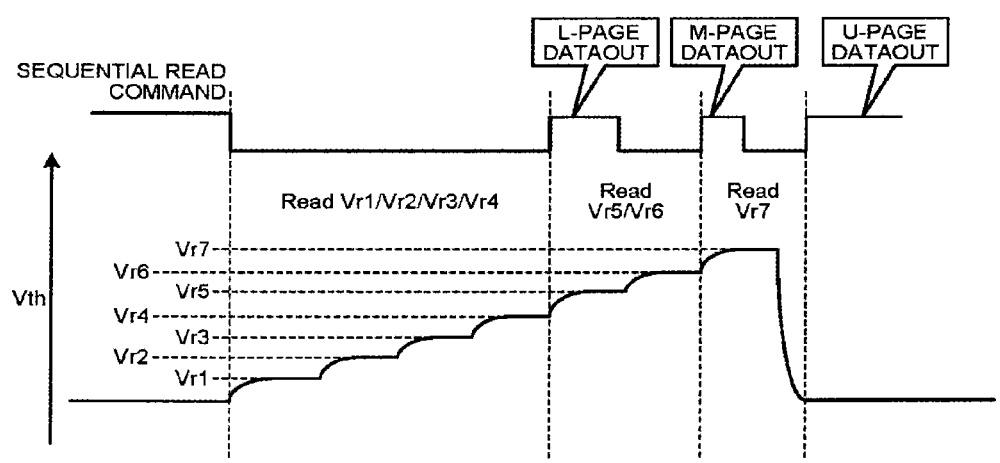
FIG. 17 is a diagram illustrating sequential reading of a third embodiment.

FIG. 17 is a diagram illustrating sequential reading of the present embodiment. As illustrated in FIG. 17, in the sequential reading of the present embodiment, the read voltage to be applied to the word line is temporarily set to Vr1 to perform the reading at the read voltage Vr1. Then, the read voltage applied to the word line is raised from Vr1 to Vr2 to perform reading at the read voltage Vr2. In subsequent processing, the read voltage is similarly raised sequentially to perform reading at the read voltages Vr3 and Vr4. Since the read voltage Vr4 is at a boundary between Lower page data "0" and "1", a value of the Lower page is determined when the reading is performed at the voltage Vr4. Thus, after the reading at the read voltage Vr4, data of the Lower page (L page) is output.

Further, the read voltage is raised sequentially to perform reading at the read voltages Vr5 and Vr6. Since data of a Middle page is determined by performing reading at the three read voltages Vr1, Vr3, and Vr6, data of the Middle page (M page) is output after the reading is performed at the voltage Vr6. It is noted that reading operations performed at the read voltages Vr5 and Vr6 may be performed during output of the data of the Lower page (L page).

Further, the read voltage is raised to perform the reading at the read voltage Vr7. Data of an Upper page is determined by performing reading at the three read voltages Vr2, Vr5, and Vr7. After the reading at the read voltage Vr7, data of the Upper page (U page) is output. It is noted that reading operations performed at the read voltage Vr7 may be performed during output of the data of the Upper page (U page).

As described above, through sequential reading performed by sequentially raising the read voltage by one level, the reading time for reading all the pages can be reduced. When the 1-3-3 data coding of the first and second embodiments is employed, the Lower page has the number of boundaries of 1, and upon application of the read voltage Vr4 defining the boundary of the Lower page, a data value of the Lower page is determined. Therefore, in the 1-3-3 data coding, a time until outputting the Lower page data is reduced when the sequential reading is performed, compared with the 2-3-2 data coding.

In the above-mentioned example, writing in three stages, i.e., the first stage, the second stage, and the third stage, has been described, but writing in two stages, i.e., the first stage and the second stage, or the first stage and third stage may be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:
   a memory cell array having a plurality of memory cells configured to store 3-bit data corresponding to first to eighth threshold regions, the 3-bit data corresponding to first to third pages, respectively; and
   a control unit configured to:
      perform a first stage program on the memory cell based on data written to the first page;
      perform a second stage program on the memory cell based on data written to the first, second, and third pages after the first stage program; and
      perform a third stage program on the memory cell based on data written to the first, second, and third pages after the second stage program, the first to third stage programs being performed using data coding of the memory cells having one boundary with different bit values for the first page among seven boundaries between adjacent threshold regions, having three boundaries with different bit values for the second page among the seven boundaries, and having three boundaries with different bit values for the third page among the seven boundaries.

2. The nonvolatile memory according to claim 1, wherein the first stage program sets a threshold voltage of the memory cell to belong to any of the two first stage threshold regions,
   the second stage program sets the threshold voltage of the memory cell to belong to any of the eight second stage threshold regions,
   the third stage program sets the threshold voltage of the memory cell to belong to any of the eight third stage threshold regions, and
   the eight third stage threshold regions extend from the first to eighth threshold regions.

3. The nonvolatile memory according to claim 2, wherein the second stage threshold region and the third stage threshold region are brought into one-to-one correspondence, and
   in the third stage program, a threshold voltage of the memory cell having a threshold voltage within the second stage threshold region is set in a corresponding third stage threshold region.

4. The nonvolatile memory according to claim 3, wherein the second stage threshold region has a width larger than that of the corresponding third stage threshold region and has a minimum value smaller than that of the corresponding third stage threshold region.

5. The nonvolatile memory according to claim 1, wherein the control unit reads data from the memory cell by sequentially using seven boundary voltages being boundaries between the threshold regions in ascending order of voltage values, a reading result is output as first page reading data upon finish of reading using the boundary voltage being the boundary between first page data values, a reading result is output as second page reading data upon finish of reading using the three boundary voltages being the boundaries between second page data values, and a reading result is output as third page reading data upon finish of reading using the three boundary voltages being boundaries between third page data values.

6. The nonvolatile memory according to claim 1, wherein the boundary voltages between the adjacent first to eighth threshold regions are defined as first to seventh boundary voltages in ascending order of threshold voltages, the boundary voltage being the boundary between the first page data values is defined as the fourth boundary voltage, the boundary voltages being the boundaries between the second page data values are defined as the second, fifth, and seventh boundary voltages, and the boundary voltages being the boundaries between the third page data values are defined as the first, third, and sixth boundary voltages.

7. The nonvolatile memory according to claim 1, wherein the boundary voltages between the adjacent first to eighth threshold regions are defined as first to seventh boundary voltages in ascending order of threshold voltages, the boundary voltage being the boundary between the first page data values is defined as the fourth boundary voltage, the boundary voltages being the boundaries between the second page data values are defined as the first, third, and sixth boundary voltages, and the boundary voltages being the boundaries between the third page data values are defined as the second, fifth, and seventh boundary voltages.

8. The nonvolatile memory according to claim 1, wherein the first to third stage programs are executed for each word line connected with the memory cells, and the first to third stage programs are executed in a non-sequential order in which, during the execution of the first to third stage programs for a first word line, the first stage program is executed for a second word line different from the first word line.

9. A memory device comprising:
a nonvolatile memory; and
a memory controller configured to control the nonvolatile memory,
the nonvolatile memory comprising:
a memory cell array having a plurality of memory cells configured to store 3-bit data corresponding to first to eighth threshold regions, the 3-bit data corresponding to first to third pages, respectively; and
a control unit configured to:
perform a first stage program on the memory cell based on data written to the first page;
perform a second stage program on the memory cell based on data written to the first, second, and third pages after the first stage program; and
perform a third stage program on the memory cell based on data written to the first, second, and third pages after the second stage program, the first to third stage programs being performed using data coding of the memory cells having one boundary with different bit values for the first page among seven boundaries between adjacent threshold regions, having three boundaries with different bit values for the second page among the seven boundaries, and having three boundaries with different bit values for the third page among the seven boundaries.

10. The memory device according to claim 9, wherein the first stage program sets a threshold voltage of the memory cell to belong to any of the two first stage threshold regions,
the second stage program sets the threshold voltage of the memory cell to belong to any of the eight second stage threshold regions,
the third stage program sets the threshold voltage of the memory cell to belong to any of the eight third stage threshold regions, and
the eight third stage threshold regions extend from the first to eighth threshold regions.

11. The memory device according to claim 10, wherein the second stage threshold region and the third stage threshold region are brought into one-to-one correspondence, and
in the third stage program, a threshold voltage of the memory cell having a threshold voltage within the second stage threshold region is set in a corresponding third stage threshold region.

12. The memory device according to claim 11, wherein the second stage threshold region has a width larger than that of the corresponding third stage threshold region and has a minimum value smaller than that of the corresponding third stage threshold region.

13. The memory device according to claim 9, wherein the control unit reads data from the memory cell by sequentially using seven boundary voltages being boundaries between the threshold regions in ascending order of voltage values, a reading result is output as first page reading data upon finish of reading using the boundary voltage being the boundary between first page data values, a reading result is output as second page reading data upon finish of reading using the three boundary voltages being the boundaries between second page data values, and a reading result is output as third page reading data upon finish of reading using the three boundary voltages being boundaries between third page data values.

14. The memory device according to claim 9, wherein the boundary voltages between the adjacent first to eighth threshold regions are defined as first to seventh boundary voltages in ascending order of threshold voltages, the boundary voltage being the boundary between the first page data values is defined as the fourth boundary voltage, the boundary voltages being the boundaries between the second page data values are defined as the second, fifth, and seventh boundary voltages, and the boundary voltages being the boundaries between the third page data values are defined as the first, third, and sixth boundary voltages.

15. The memory device according to claim 9, wherein the boundary voltages between the adjacent first to eighth threshold regions are defined as first to seventh boundary voltages in ascending order of threshold voltages, the boundary voltage being the boundary between the first page data values is defined as the fourth boundary voltage, the boundary voltages being the boundaries between the second page data values are defined as the first, third, and sixth boundary voltages, and the boundary voltages being the boundaries between the third page data values are defined as the second, fifth, and seventh boundary voltages.

16. The memory device according to claim 9, wherein the first to third stage programs are executed for each word line connected with the memory cells, and the first to third stage programs are executed in a non-sequential order in which, during the execution of the first to third stage programs for a first word line, the first stage program is executed for a second word line different from the first word line.

17. A data writing method for a nonvolatile memory having a memory cell array having a plurality of memory cells configured to store 3-bit data corresponding to first to eighth threshold regions, the 3-bit data corresponding to first to third pages, respectively, the method comprising:
performing a first stage program on the memory cell based on data written to the first page, using data coding of the memory cells having one boundary with different bit values for the first page among seven boundaries between adjacent threshold regions, having three boundaries with different bit values for the second page among the seven boundaries, and having three boundaries with different bit values for the third page among the seven boundaries;
performing a second stage program on the memory cell based on data written to the first, second, and third pages after the first stage program, using the data coding; and
performing a third stage program on the memory cell based on data written to the first, second, and third pages after the second stage program, using the data coding.

18. The data writing method according to claim 17, wherein the first stage program sets a threshold voltage of the memory cell to belong to any of the two first stage threshold regions, the second stage program sets the threshold voltage of the memory cell to belong to any of the eight second stage threshold regions, the third stage program sets the threshold voltage of the memory cell to belong to any of the eight third stage threshold regions, and the eight third stage threshold regions extend from the first to eighth threshold regions.

19. The data writing method according to claim 18, wherein the second stage threshold region and the third stage threshold region are brought into one-to-one correspondence, and in the third stage program, a threshold voltage of the memory cell having a threshold voltage within the second stage threshold region is set in a corresponding third stage threshold region.

20. The data writing method according to claim 19, wherein the second stage threshold region has a width larger than that of the corresponding third stage threshold region and has a minimum value smaller than that of the corresponding third stage threshold region.

\* \* \* \* \*